(12) United States Patent
Ebbers

(10) Patent No.: US 6,544,330 B2
(45) Date of Patent: Apr. 8, 2003

(54) BONDED, WALK-OFF COMPENSATED OPTICAL ELEMENTS

(75) Inventor: Christopher A. Ebbers, Livermore, CA (US)

(73) Assignee: The United States of America as represented by the Department of Energy, Washington, DC (US)

( * ) Notice: Subject to any disclaimer, the term of this patent is extended or adjusted under 35 U.S.C. 154(b) by 0 days.

(21) Appl. No.: 09/783,508

(22) Filed: Feb. 14, 2001

(65) Prior Publication Data

US 2002/0108556 A1 Aug. 15, 2002

(51) Int. Cl.[7] .............................................. C30B 29/30
(52) U.S. Cl. ........................ 117/2; 117/1; 117/944; 117/945; 117/946; 359/485; 315/1; 315/11; 315/12; 315/14
(58) Field of Search ...................... 117/1, 2, 944, 117/945, 946; 385/1, 11, 12, 14; 359/483

(56) References Cited

U.S. PATENT DOCUMENTS

| 5,047,668 A | | 9/1991 | Bosenberg |
| 5,475,526 A | | 12/1995 | Byer et al. |
| 5,477,378 A | | 12/1995 | Johnson |
| 5,652,674 A | * | 7/1997 | Mizuuchi et al. ........... 359/326 |
| 5,846,638 A | * | 12/1998 | Meissner ........................ 117/1 |
| 5,852,622 A | | 12/1998 | Meissner et al. |
| 6,025,060 A | | 2/2000 | Meissner |
| 6,026,203 A | * | 2/2000 | Chang .......................... 385/11 |
| 6,118,910 A | * | 9/2000 | Chang .......................... 385/16 |

OTHER PUBLICATIONS

F. Brehat and B. Wyncke "Calculation of Double–Refraction Walk–off Angle along the Phase–matching Directions in Non–linear Biaxial Crystals" *J. Phys B At. Mol. Opt. Phys.* 22 pp. 1891–1898 (1989).
Eric Cheung et. al. High Power Conversion to Mid–IR Using KTP and ZGP OPO's, *1999 Advanced Solid–State Lasers Conference* WC1–1 pp. 358–361 (Boston, Massachusetts 1999).
Rowan, et al., "Mechanical Losses Associated with the Technique of Hydroxide–catalysis Bonding of Fused Silica," *Physics Letters A*, 246, pp. 471–478 (1998).
Tajima, et al., "Performance of Composite Glass Slab Laser," *IEEE J. Quantum Electronics*, vol. 28, No. 6, Jun. 1992, pp. 1562–1569.

* cited by examiner

*Primary Examiner*—Robert Kunemund
(74) *Attorney, Agent, or Firm*—William C. Daubenspeck; Paul A. Gottlieb

(57) ABSTRACT

A bonded, walk-off compensated crystal, for use with optical equipment, and methods of making optical components including same.

3 Claims, 1 Drawing Sheet

BONDED, WALK-OFF COMPENSATED OPTICAL ELEMENTS

GOVERNMENT RIGHTS

The United States Government has rights in this invention pursuant to Contract No. W-7405-ENG-48 between the United States Department of Energy and the University of California for the operation of the Lawrence Livermore National Laboratory.

BACKGROUND OF THE INVENTION

1. Field of the Invention (Technical Field)

The present invention relates to bonded, walk-off compensated optical elements.

2. Background Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

SUMMARY OF THE INVENTION (DISCLOSURE OF THE INVENTION)

The present invention comprises a bonded, walk-off compensated crystal and methods of making the same. In one embodiment, a bonded, walk-off compensated crystal comprises at least one nonlinear optical crystal wherein at least one nonlinear optical crystal is bonded to at least one other crystal. According to this embodiment, and others, the bonded crystals comprise a single crystal even though one of ordinary skill in the art may argue that bonding methods presented herein, and equivalents thereof, do not create a single crystal. Accordingly, "crystal" for purposes of the specification and claims is defined to also include bonded, walk-off compensated crystals. Further to this embodiment, the at least one other crystal optionally comprises a nonlinear optical crystal. In another variation of this embodiment, the compensated crystal optionally comprises at least one walk-off compensated bonded crystal pair wherein the at least one bonded crystal pair optionally comprises at least one nonlinear crystal pair.

As disclosed herein, crystals suitable for use with the present invention optionally comprise at least one crystal selected from the group consisting of $BaB_2O_4$, $LiNbO_3$, $LiIO_3$, $KTiOPO_4$, $RbTiOAsO_4$, $LiB_3O_5$, and $KH_2PO_4$.

The present invention also comprises methods for making a bonded, walk-off compensated crystal. According to one embodiment, the invention comprises a method of making a bonded, walk-off compensated crystal comprising the steps of: providing two crystals; orientating the two crystals; and bonding the orientated crystals. In this particular method, the bonding step optionally comprises the steps of: optical contacting the two oriented crystals; and heating the contacted, oriented crystals to a temperature less than the melting point of either crystal. Alternatively, or in conjunction with this aforementioned method of bonding, the two crystals optionally comprise silica and the step of bonding optionally comprises the step of introducing a basic solution between the two crystals to initiate hydroxide catalyzed bonding of the two crystals. In yet another alternative, or in conjunction with these aforementioned methods of bonding, the step of bonding comprises the steps of: contacting the two crystals; applying pressure to the two crystals; and heating the two crystals to a temperature less than the temperature at which a crystal to liquid phase transition occurs for the given pressure.

According to the methods of the present invention, the two crystals optionally comprise crystals selected from the group consisting of $BaB_2O_4$, $LiNbO_3$, $LiIO_3$, $KTiOPO_4$, $RbTiOAsO_4$, $LiB_3O_5$, and $KH_2PO_4$.

A primary object of the present invention is to provide better walk-off compensated optical components.

A primary advantage of the present invention is to provide better performing optical components.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

BEST MODES FOR CARRYING OUT THE INVENTION

Figure 1:
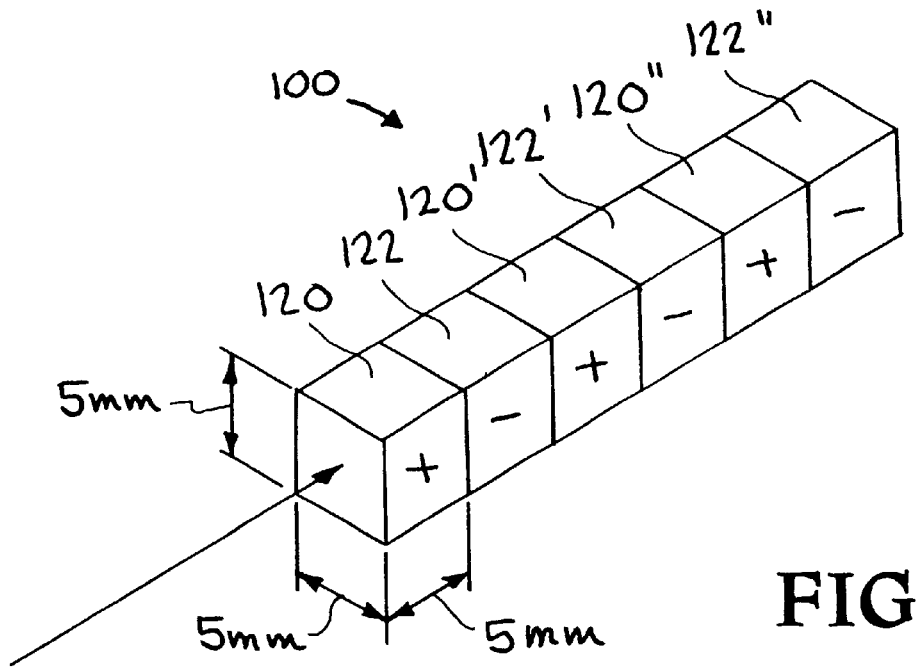
FIG. 1 is a perspective view illustration of a first bonded, walk-off compensated crystal according to an embodiment of the present invention.

The present invention comprises a walk-off compensated, diffusion bonded, optical parametric oscillator and/or optical parametric amplifier and methods of making and using the same. The present invention comprises walk-off compensated crystal architecture techniques and diffusion bonding of crystalline materials techniques that are known to those of ordinary skill in the art. According to an embodiment of the present invention, walk-off and diffusion bonding techniques are combined to provide a synergistic effect and a particularly useful optical parametric oscillator and/or optical parametric amplifier. Accordingly, diffusion bonded walk-off compensated optical parametric oscillators and/or amplifiers of various embodiments of the present invention exhibit a significant increase in conversion efficiency and operate with a reduced threshold, compared to either individual optical parametric oscillators of the equivalent length, or walk-off compensated individual crystals with the equivalent length. Crystals suitable for use in optical equipment (e.g., second harmonic generators, sum frequency generators, difference frequency generators, optical parametric oscillators and optical parametric amplifiers) include, but are not limited to, $BaB_2O_4$ (BBO), $LiNbO_3$, $LiIO_3$, RbTiOAsO$_4$ (RTA), KTiOPO$_4$ (KTP), LiB$_3$O$_5$, and KH$_2$PO$_4$ (KDP). The present invention encompasses these and other crystals that are useful in optical equipment.

Optical Parametric Oscillators and Optical Parametric Amplifiers

Optical parametric oscillators are useful, nonlinear optical devices, used to extend the frequency range of fixed (or nearly fixed) laser sources. A typical application of such a device is to take a laser source, known as a pump laser, such as a Q-switched Nd:YAG laser (a neodymium-doped yttrium aluminum garnet laser, wherein YAG is Y$_3$Al$_5$O$_{12}$) with a frequency near 1.064 microns, and to use this laser to pump an optical parametric oscillator to generate an 'eyesafe' signal wavelength near approximately 1.555 microns and a corresponding idler wavelength near approximately 3.369 microns. "Signal" and "idler" usually refer to the mid-wave wavelength and the longest wavelength, respectively. An optical parametric oscillator thus acts as an inverse sum frequency generator wherein a pump beam produces a signal beam and an idler beam. Optical parametric oscillators and optical parametric amplifiers conserve both energy and momentum. Efficiency of an optical parametric oscillator is determined by the amount of depletion of the pump wavelength as it generates signal and idler wavelengths. In practice, an efficiency of 75% pump depletion is considered 'excellent' by one of ordinary skill in the art. An optical parametric amplifier operates in a similar manner to the optical parametric oscillator, except that in addition to a pump laser, either a signal wavelength or idler wavelength or both wavelengths are also present. The optical parametric amplifier serves to transfer energy from the pump laser to the other wavelengths present, 'amplifying' the existing signal or idler wavelengths. Again, in practice, achieving an efficiency whereby 75% of the existing pump energy is transferred to the signal and idler wavelengths is considered 'high efficiency'.

Walk-off in Optical Parametric Oscillators

Efficiency of an optical parametric oscillator (OPO) or an optical parametric amplifier (OPA) is governed by several factors, one of which is the effective nonlinear optical crystal length: the length over which pump and signal and idler beams interact. This effective length may be less than the crystal's actual length. The actual length is shortened by an amount that depends on the diameter of the pump, signal, and idler beams as well as the internal propagation angle (the angle between-the propagation direction of the pump relative to the propagation direction of either the signal or idler beam or both as the beams propagate through the crystal). This difference in the propagation directions produces "walk-off" of the pump beam with respect to the signal or idler beam such that actual interaction between the beams occurs only over a limited length of the crystal. This "walk-off angle" is easily determined by one of ordinary skill in the art. For a phasematched interaction, for example, in a KTP crystal optical parametric oscillator where a 1064 nm pump laser is used to generate a 2128 nm signal and 2128 nm idler (also known as a degenerate OPO), the phasematching angle occurs at approximately 43 degrees from the Z axis in the Z-Y crystallographic plane. The walkoff angle between the pump and either the signal or idler for this process is approximately 2.48 degrees. As the pump and signal beams propagate through the crystal, they are spatially separated by a distance D given by the equation:

$$D = L \tan(\rho)$$

where D is the separation between the center of the pump beam and the center of the signal beam, L is the propagation distance through the crystal, and (rho) $\rho$ is the walkoff angle as may be calculated, see for example the teachings of F. Brehat and B. Wyncke "Calculation of double-refraction walk-off angle along the phase-matching directions in non-linear biaxial crystals" *J. Phys B At. Mol. Opt. Phys.* 22 pp. 1891–1898 (1989).

The effective interaction length of the crystal is approximately determined when the separation distance, D, is greater than ½ of the average beam diameter of the pump and signal beams. For the above example, the effective interaction length for a pump beam of 5 mm diameter is approximately 57.8 mm. For a pump beam of 1 mm in diameter the effective interaction length is approximately 11.56 mm. Finally, for a pump beam of 0.1 mm in diameter, the effective interaction length for the above interaction is 1.15 mm. Typical optical parametric amplifiers and optical parametric parametric oscillator crystals are approximately 15 mm to approximately 50 mm in length. Typical pump beam diameters range from approximately 0.1 mm to approximately 5 mm. Thus, for a range of pump beam diameters and crystal lengths, the effective interaction length is significantly shorter than the actual crystal length.

A variety of techniques have been proposed to compensate for the effects of walk-off. U.S. Pat. No. 5,047,668, entitled "Optical walkoff compensation in critically phase-matched three-wave frequency conversion systems," to Bosenberg, issued Sep. 10, 1991 ('668 Patent) discloses a system for walk-off compensation that includes a pair of nonlinear crystals. According to the '668 Patent, the crystals are (i) aligned in an optical cavity with their optical axes at an angle θ with respect to the axis of the cavity and (ii) oppositely disposed with respect to the cavity axis so that the angle between their respective optical axes is 2θ. Thus, the pump beam "walks off" the signal beam in the first crystal and "walks on" the signal beam in the second crystal. This arrangement was shown to increase efficiency. The entire specification of the '688 Patent is incorporated herein by reference.

U.S. Pat. No. 5,477,378, entitled "Multiple crystal nonlinear frequency conversion apparatus," to Johnson, issued Dec. 19, 1995 ('378 Patent) discloses the use of two frequency conversion crystals with only one being active in the frequency conversion process for a defined portion of the selected tuning range, while the other serves as a beam displacement compensator in an inactive status. In one embodiment of the '378 Patent, the crystals are mounted on separate stages which are capable of synchronized rotational movement. Synchronized movement is achieved through a connect belt or band that connects the stages. The entire specification of the '378 Patent is incorporated herein by reference.

Also known in the art is a condition known as noncritical phasematching. Noncritical phasematching results in an effective length that is nearly identical to the actual length. However, for each crystal, only a small range of idler, signal, and pump wavelengths are noncritically phasematched. In particular, for two examples, the interaction in KTP or KTA for the case of a degenerate OPO (an OPO or OPA in which the idler or signal wavelength is approximately ½ of the pump wavelength) pumped by a Nd:YAG laser, walk-off is the significant factor which limits the conversion efficiency. Another pertinent example, is in the case of KTA where it is desired to generate an approximately 1.555 micron wavelength signal beam and an approximately 3.36 micron wavelength idler beam from an approximately 1.064 micron wavelength pump beam (Nd:YAG). In KTA, for this interaction, walkoff again acts as a limiting factor in the conversion efficiency. On the other hand, KTP is not limited for this particular process, due to a difference in the refractive indices. However, for a high average power laser (>10w), the 3.36 micron wavelength idler beam is strongly absorbed in the KTP crystal, negating the potential benefit of the smaller walk-off present in the KTP crystal. That is, for high power applications, KTA is the more desirable crystal from a perspective accounting for the average power use, but is less desirable than KTP due to the walk-off limitation of KTA with respect to KTA.

In walk-off compensation techniques, known in the art, for example, two crystals, such as KTP, are cut with a particular orientation with respect to each other, such that both are phasematched for the particular process, but in one crystal the walk-off is of opposite sign as the other. In this way, the effective interaction length is doubled for each pair of crystals utilized. Such arrangements of walk-off compensated crystals have been demonstrated in up to 3 crystal pairs. See, e.g., Eric Cheung et. al. High Power Conversion to Mid-IR Using KTP and ZGP OPO's", 1999 Advanced Solid-State Lasers Conference WC1-1 pp. 358–361 (Boston, Mass. 1999), which is incorporated herein by reference.

However, for each crystal pair, additional losses and potential for surface damage are introduced, due to the need for an additional pair of polished surfaces. A single crystal comprises, for example, two polished and preferably antireflection-coated surfaces. Thus, two walk-off compensated crystals comprise, for example, 4 polished surfaces, etc. As known in the art of optics and/or electromagnetics, each surface or interface introduces a loss. The present invention comprises an apparatus and method to eliminate and/or reduce this surface or interface loss.

Bonding

According to the present invention, bonding is a process via which two highly polished optical surfaces are bonded and the resulting interface between the bonded optical surfaces is relatively lossless. The present invention comprises a variety of methods for bonding, including, but not limited to, those disclosed below.

A variety of techniques exist for bonding of optical elements, such as, but not limited to, bonding of crystals. For example, patents assigned to Onyx Optics, Inc. (Dublin, California) describe techniques for bonding of optical elements. For example, U.S. Pat. No. 5,852,622, entitled "Solid state lasers with composite crystal or glass components," to Meissner, et al., issued Dec. 22, 1998 ('622 Patent), discloses improvement of thermal uniformity, beam quality and lasing efficiency of composite solid state lasers through bonding one or more laser-interactive or laser-radiation-absorbing layers to a laserable medium. The entire specification of the '622 Patent is incorporated herein by reference. According to the '622 Patent, the bond between laserable and laser-inactive media is created without the use of any inorganic or organic adhesive means. Rather, the bond is due to intermolecular attractive forces between polished surfaces that are contacted and subsequently heat treated to strengthen the bond to an extent that it withstands laser operating conditions. According to the '622 Patent, "diffusion at the interface may occur but is not required to reach a bond strength which is sufficient to allow subsequent processing such as cutting, grinding, polishing and deposition of optical coatings." However, "diffusion of gaseous species, mainly water vapor, at the interface between the two bodies" occurs at lower heat treatment temperatures and "some interdiffusion between species of adjacent surfaces will occur at more elevated temperatures." The '662 Patent further states that "the theoretical mechanism of bonding is not critical for the present invention and is in fact not completely understood and is believed to vary for different substances."

Two steps are common to the formation of any composite by the disclosed method of the '622 Patent: optical contacting and heating. Optical contacting, according to the '622 Patent, implies that there are no areas at the interface which contain gaseous or solid inclusions since such inclusions would prevent the disappearance of interference fringes in the vicinity of the inclusion, i.e., optical contacting ensures substantial freedom of defects. The '622 Patent also discloses the use of surfaces coated with reflection, anti-reflection, polarizer, or other specialized coatings. Heating, or heat treatment, provides for a bond strength between optically contacted components (assembly) wherein the bond strength is greater than that of the untreated assembly.

Another patent assigned to Onyx Optics, Inc. is U.S. Pat. No. 6,025,060, entitled "Method and apparatus for composite gemstones," to Meissner, issued Feb. 15, 2000 ('060 Patent). The '060 Patent discloses an optical contacting and heating method for fabrication of a variety of waveguide structures. According to the '060 Patent, this method (a) reduces losses at interfaces, particularly scattering losses; (b) is applicable to crystalline laser media and nonlinear optical crystals; (c) can fabricate waveguide structures up to 100–200 mm in length; and (d) bond waveguide structures to other laser-active or inactive components, nonlinear optical crystals, optical fibers, beam launching modules, and laser pump modules. In addition, the '060 Patent states that "nonlinear optical waveguides can be constructed from the combinations of nonlinear-optical waveguide cores or layers and cladding layers which are in either the same or different crystallographic orientations." Another patent assigned to Onyx Optics, Inc. discloses a substantially similar method, see U.S. Pat. No. 5,846,638, entitled "Composite optical and electro-optical devices," to Meissner, issued Dec. 8, 1998 ('638 Patent). The entire specification of the '060 and '638 Patents are incorporated herein by reference. Onyx Optics, Inc. is but one example of a source of bonded optical elements and/or bonding services.

Another bonding method is disclosed in Rowan, et al., "Mechanical losses associated with the technique of hydroxide-catalysis bonding of fused silica," *Physics Letters A*, 246, pp. 471–478 (1998), which is incorporated herein by reference. This reference discloses a hydroxide-catalysis bonding method for bonding surfaces of optical elements. The method of Rowan, et al., consists of preparing fused silica surfaces to be bonded, introducing a solution of potassium hydroxide (e.g., 1:500 molecular number ratio of $KOH:H_2O$) between the fused silica surfaces to be bonded, and initiating bonding through hydroxide-catalyzed surface hydration and dehydration at room temperature. According to the article of Rowan, et al., surface silanol groups are generated which form siloxane bridges to bond the two substrates through a siloxane network. This article also states that the method may be adaptable for use in jointing dissimilar materials that are oxides or have surface oxide layers.

Yet another method of bonding comprises "diffusion" bonding. U.S. Pat. No. 5,475,526, entitled "Method using a monolithic crystalline material for producing radiation by quasi-phase-matching, diffusion bonded monolithic crystalline material for quasi-phase-matching, and method for fabricating same," to Byer, et al., issued Dec. 12, 1995 ('526 Patent), states that diffusion bonding has been studied for Nd:YAG crystals and disclosed in Tajima, et al., "Performance of composite glass slab laser," *IEEE J. Quantum*

*Electronics*, Vol. 28, No. 6, June 1992, pp. 1562–1569. This article and the '526 Patent are incorporated herein by reference. According to the '526 Patent, "diffusion bonding is in contrast to the temporary bond which can be achieved via optical contacting commonly used for many purposes in optics. It is superior . . . a) because it forms a permanent bond, b) because it has no air layer, minimizing any reflection at the interface, and c) because a diffusion bond retains the thermal mechanical properties of the bulk material." The process described in the '526 Patent consists of stacking components, applying pressure to the stack and increasing the temperature to cause meaningful migration of across the interface while remaining below the melting temperature (temperature at which crystal to liquid phase transition occurs for the given pressure). In one example, gallium arsenide wafers (components) were cleaned with a microdetergent and further scrubbed in deionized water, in trichloroethane, in acetone and in methanol. The components were stacked and placed in an oven with a 5% hydrogen atmosphere to inhibit oxidation, with a nitrogen flow sufficient to transport particulate matter. The oven temperature was raised to a temperature greater than approximately 500 C over a period of one hour and kept at 820 C for a period of at least two hours. Subsequently, the oven was allowed to cool for eight hours.

All of the aforementioned bonding methods are suitable for use in embodiments of the present invention. Collectively, these methods are referred to herein as "bonding" methods.

Bonded, Walk-off Compensated Optical Parametric Oscillators and Optical Parametric Amplifiers The present invention comprises apparatus and methods for bonded, walk-off compensated optical elements, in particular bonded, walk-off compensated optical parametric oscillators (BCOPOs) and bonded, walk-off compensated optical parametric amplifiers (BCOPA's). Examples of BCOPOs and/or BCOPAs, described more fully below, exhibit very low levels of interface losses. In one embodiment, a BCOPO or BCOPA comprises at least one bonded nonlinear crystal. This inventive BCOPO exhibits superior characteristics when compared to a single crystal of equivalent length and when compared to two pairs of individual walk-off compensated crystal pairs with a total length equivalent to the walk-off compensated bonded crystal.

A useful number of bonded crystals for a typical OPO or OPA crystal approximately 30 mm in length ranges from a minimum of two crystals (e.g., approximately one bond) to a maximum of approximately 10 crystals (e.g., approximately 9 bonds). While in principal more than approximately 10 crystals (e.g., 9 bonds) could be used to form a "single" crystal; the practical issue of bonding without making a number of defects becomes a potential issue.

The present invention, however, is not limited to OPO's or OPA's because bonded, walk-off compensation is applicable in general to all optical components that comprise at least one nonlinear optical crystal.

The present invention is particularly useful for optical elements comprising $LiNbO_3$, KTP, KTA, and/or RTA. More specifically, the present invention is useful for high average power, high efficiency, optical parametric oscillators; optical parametric amplifiers high average power, high efficiency, degenerate KTP or KTA OPOs or OPA's for Nd:YAG, Nd:YLF or other near infrared lasers; and/or high average power, high efficiency KTA OPOs or OPA's for generation of a 1.555 nm wavelengths. Additionally, the present invention is optionally useful in high efficiency degenerate OPOs or OPA's for $Nd:YVO_4$, Nd:YAG, or Nd:YLF lasers.

In general, the present invention comprises bonded optical elements. For example, in one embodiment, the present invention comprises a bonded, walk-off compensated, nonlinear optical crystal. In this embodiment, the crystal comprises a clear aperture of, for example, approximately 5 mm by 5 mm. The crystal comprises an overall length of, for example, approximately 30 mm. The crystal comprises an effective "single" crystal that comprises, for example, approximately six individual bonded crystals, i.e., three crystal pairs. Such an embodiment is shown in FIG. 1. Referring to FIG. 1, a "single" bonded, walk-off compensated crystal 100 is shown. This crystal 100 comprises six individual crystals 120, 120', 120", 122', 122", 122''' that have been bonded together according to methods disclosed herein. These six crystals comprise three pairs, labeled alternatively with "+" (120, 120', 120") and "−" (122, 122', 122") signs in FIG. 1. In this embodiment, for example, in the first section (0 mm to 5 mm), due to orientation, walk-off occurs towards the top of crystal 120; and, in the second section (5 mm to 10 mm), walk-off occurs towards the bottom, thus, compensating for walk-off in the first section. Crystal pair 120' and 122' mimic, for example, crystal pair 120 and 122. Crystal pair 120" and 122" mimic, for example, crystal pair 120 and 122. Of course, other orientations are possible to optimize compensation of walk-off effects. While walk-off towards top and bottom are mentioned, this embodiment is useful for walk-off towards any crystal side normal to incident wave propagation; walk-off compensation towards/away from corners is also within the scope of the present invention. In addition, bonded crystals optionally comprise geometry other than square and other than rectangular. For example, round, polygonal, elliptical and other shaped crystals are optionally suitable. Further, bonded crystal faces optionally differ from flat surfaces and/or surfaces normal to the direction of wave propagation. For example, interface surfaces include concave/convex pairs, angled pairs, and the like.

Figure 2:
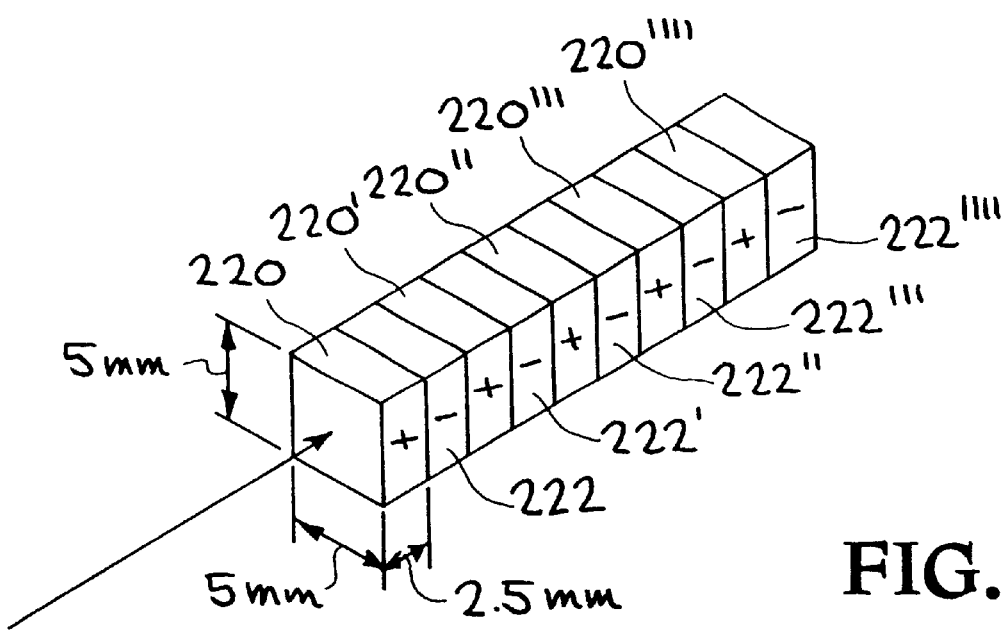
FIG. 2 is a perspective view illustration of a second bonded, walk-off compensated crystal according to an embodiment of the present invention.

In another embodiment, shown in FIG. 2, a bonded, walk-off compensated nonlinear optical crystal 200 is shown. This crystal 200 comprises 10 individual crystals 220, 220', 220", 220''', 220'''', 222, 222', 222", 222''', and 222'''' that have been bonded together according to a method disclosed herein. These ten crystals comprise five pairs, labeled alternatively with "+" (220, 220', 220", 220''', 220'''') and "−" (222, 222', 222", 222''', 222'''') signs in FIG. 2. In this embodiment, for example, in the first section (0 mm to 2.5 mm), due to orientation, walk-off occurs towards the right side of crystal 220; and, in the second section (2.5 mm to 5 mm), walk-off occurs towards the left side, thus, compensating for walk-off in the first section. Crystal pair 220' and 222' mimic, for example, crystal pair 220 and 222. Crystal pair 220" and 222" mimic, for example, crystal pair 220 and 222. Of course, other orientations are possible to optimize compensation of walk-off effects. While walk-off towards the right and left are mentioned, this embodiment is useful for walk-off towards any crystal side normal to incident wave propagation; walk-off compensation towards/ away from corners is also within the scope of the present invention. In addition, bonded crystals optionally comprise geometry other than square and other than rectangular. For example, round, polygonal, elliptical and other shaped crystals are optionally suitable. Further, bonded crystal faces optionally differ from flat surfaces and/or surfaces normal to the direction of wave propagation. For example, interface surfaces include concave/convex pairs, angled pairs, and the like.

In general, particular individual crystal thickness depends upon the walk-off limited length, which is dependent upon crystal orientation necessary for a particular phasematching process and the aperture of the incident laser radiation. Typically, individual crystal thickness lies within a range of approximately 1 mm to approximately 7.5 mm.

In one embodiment, the present invention comprises a bonded degenerate OPO for generating twice the wavelength of the input wavelength, e.g., for Nd:YAG pump wavelength at 1.064 microns a degenerate OPO produces 2.128 microns, utilizing at least one $LiNbO_3$, KTP, KTA, and/or RTA nonlinear optical crystal. For a typical aperture of approximately 5 mm, walk-off compensated crystal pairs each with an individual length approximately 5 mm to approximately 10 mm are bonded together in pairs, to produce a "single" crystal with the final desired length (typically approximately 30 to approximately 50 mm in length).

In another embodiment, the present invention comprises a bonded KTA and/or RTA OPO for generating near 1.55 microns and the corresponding signal wavelength from a pump laser such as Nd:YAG, Nd:YLF, Nd:YVO4, or Nd:YAP (emitting wavelengths of 1.064, 1.053 or 1.047, 1.064, and 1.079 microns, respectively). For a typical aperture of approximately 5 mm, walk-off compensated crystal pairs of approximately 5 to approximately 10 mm are bonded together to produce a "single" crystal with the final desired length (typically approximately 30 mm to approximately 50 mm in length).

Industrial Applicability:

The invention is further illustrated by the following non-limiting examples. There are several particular examples involving KTP, KTA, and RTA in which the present invention is particularly useful.

EXAMPLE 1

This example comprises a diffusion bonded degenerate OPO for generating twice the wavelength of an input wavelength, e.g., for a Nd:YAG pump wavelength at approximately 1.064 microns a degenerate OPO produces approximately 2.128 microns, utilizing $LiNbO_3$, KTP, KTA, and/or RTA as a nonlinear optical crystal. For a typical crystal aperture of approximately 5 mm, walk-off compensated crystal pairs each with an individual length of approximately 5 mm to approximately 10 mm are bonded together in pairs, to produce a crystal with the final desired length (typically approximately 30 mm to approximately 50 mm in length).

EXAMPLE 2

This example comprises a diffusion bonded KTA and/or RTA OPO for generating near 1.55 microns and the corresponding signal wavelength from a pump laser such as Nd:YAG, Nd:YLF, Nd:YVO4, or Nd:YAP (emitting wavelengths of 1.064, 1.053 or 1.047, 1.064, and 1.079 microns, respectively). For a typical aperture of approximately 5 mm, walk-off compensated crystal pairs of approximately 5 mm to approximately 10 mm in length are bonded together to produce a single crystal with the final desired length (typically approximately 30 mm to approximately 50 mm in length).

EXAMPLE 3

Two crystals of $KTiOPO_4$ are sectioned and bonded together to form a "single" crystal. One crystal is labeled "A" and the other is labeled "B." The dimensions of crystal A are approximately 5 mm by approximately 5 mm by approximately 15 mm. The dimensions of crystal B are approximately 5 mm by approximately 5 mm by approximately 15 mm . For crystals A and B, the 5 mm by 5 mm faces comprise laser grade optical surfaces. Crystal A exhibits a walk-off angle of different sign than Crystal B.

Next, crystals A and B are sectioned along the 15 mm length to approximately 5 mm sections. The three crystal A sections and three crystal B sections are bonded together in an order A-B-A-B-A-B sequence using a bonding method selected from those referenced above, e.g., a method according to an Onyx Optics, Inc. patent. A "single" crystal is formed comprising a length of approximately 30 mm having two 5 mm by 5 mm faces, e.g., polished faces.

EXAMPLE 4

Two crystals of $KTiOPO_4$ are sectioned and bonded together to form a "single" crystal. One crystal is labeled "A" and the other is labeled "B." Crystal A exhibits a walk-off angle of different sign than Crystal B. The dimensions of crystal A are approximately 5 mm by approximately 5 mm by approximately 15 mm. The dimensions of crystal B are approximately 5 mm by approximately 5 mm by approximately 15 mm. For crystals A and B, the 5 mm by 5 mm faces comprise laser grade optical surfaces.

Next, crystals A and B are sectioned along the 15 mm length to approximately 7.5 mm sections. The two crystal A sections and two crystal B sections are bonded together in an A-B-A-B sequence using a bonding method selected from those referenced above, e.g., a method according to an Onyx Optics, Inc. patent. A "single" crystal is formed comprising a length of approximately 30 mm having two 5 mm by 5 mm faces, e.g., polished faces.

EXAMPLE 5

Two crystals of $KTiOPO_4$ are sectioned and bonded together to form a "single" crystal. One crystal is labeled "A" and the other is labeled "B." Crystal A exhibits a walk-off angle of different sign than Crystal B. Crystals A and B are sectioned so as to form walk-off compensated pairs. For example, such pairs are useful for degenerate optical parametric oscillation of 2.218 microns when pumped by a 1.064 micron source. In this particular example angle the walk-off angle is approximately 2.47 degrees. For a pump beam of 0.5 mm diameter the walk-off limited length is approximately 5.5 mm.

The dimensions of crystal A are approximately 5 mm by approximately 5 mm by approximately 15 mm. The dimensions of crystal B are approximately 5 mm by approximately 5 mm by approximately 15 mm . For crystals A and B, the 5 mm by 5 mm faces comprise laser grade optical surfaces.

Next, crystals A and B are sectioned along the 15 mm length to approximately 5 mm sections. The three crystal A sections and three crystal B sections are bonded together in an A-B-A-B-A-B sequence using a bonding method selected from those referenced above, e.g., a method according to an Onyx Optics, Inc. patent. A "single" crystal is formed comprising a length of approximately 30 mm having two 5 mm by 5 mm faces, e.g., polished faces. The final 'single crystal' is composed of individual crystal segments shorter than the walk-off limited length. Thus the final 'single crystal' has an effective length that is similar to the walk-off limited length.

EXAMPLE 6

Two crystals of $KTiOPO_4$ are sectioned and bonded together to form a "single" crystal. One crystal is labeled "A" and the other is labeled "B." Crystal A exhibits a walk-off angle of different sign than Crystal B. Crystals A and B are sectioned so as to form walk-off compensated pairs. For example, such pairs are useful for degenerate optical parametric oscillation of 2.218 microns when pumped by a 1.064 micron source. In this particular example angle the walk-off angle is approximately 2.47 degrees. As can be calculated, for a pump beam of 0.6 mm diameter with the given walk-off angle of 2.47 degrees, the walk-off limited length is approximately 7.5 mm.

The dimensions of crystal A are approximately 5 mm by approximately 5 mm by approximately 15 mm. The dimensions of crystal B are approximately 5 mm by approximately 5 mm by approximately 15 mm . For crystals A and B, the 5 mm by 5 mm faces comprise laser grade optical surfaces.

Next, crystals A and B are sectioned along the 15 mm length to approximately 7.5 mm sections. The two crystal A sections and two crystal B sections are bonded together in an A-B-A-B sequence using a bonding method selected from those referenced above, e.g., a method according to an Onyx Optics, Inc. patent. A "single" crystal is formed comprising a length of approximately 30 mm having two 5 mm by 5 mm faces, e.g., polished faces. The final 'single crystal' is composed of individual crystal segments shorter than the walk-off limited length. Thus the final 'single crystal' has an effective length that is similar to the walk-off limited length. Note that the length of the particular crystal segment (either A or B) is dependent upon both the walk-off angle for the particular wavelength interaction as well as the size of the pump beam, idler beam, and signal beam. In this particular case the larger pump beam diameter allows the use of longer individual crystal segments.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. An optical parametric component for using radiation from a pump laser source at a first wavelength to pump a signal at a second wavelength having improved efficiency comprising:

a) coupling said signal at a second wavelength through at least one nonlinear crystal pair, the second crystal of said crystal pair having a walkoff equal and opposite to the walkoff of the first crystal of said crystal pair to maintain proximity and facilitate interaction between said signal at said first wavelength and said signal at said second wavelength; and b) bonding said nonlinear optical crystal pair together to minimize losses at the interface of the crystals.

2. The optical parametric component of claim 1 wherein said nonlinear crystal pair comprises at least one crystal selected from the group consisting of $BaB_2O_4$, $LiNbO_3$, $LiIO_3$, $KTiOPO_4$, $RbTiOAsO_4$, $LiB_3O_5$, and $KH_2PO_4$.

3. The optical parametric component of claim 1 wherein said optical component is selected from the group consisting of optical parametric oscillators, optical parametric amplifiers, second harmonic generators, sum frequency generators and difference frequency generator.

* * * * *